(12) United States Patent
Fujiwara et al.

(10) Patent No.: US 9,455,376 B2
(45) Date of Patent: Sep. 27, 2016

(54) SUBSTRATE FOR NITRIDE SEMICONDUCTOR DEVICE AND PRODUCTION METHOD THEREOF, AND RED LIGHT EMITTING SEMICONDUCTOR DEVICE AND PRODUCTION METHOD THEREOF

(71) Applicant: OSAKA UNIVERSITY, Suita-shi, Osaka (JP)

(72) Inventors: Yasufumi Fujiwara, Suita (JP); Atsushi Koizumi, Suita (JP); Yoshikazu Terai, Suita (JP)

(73) Assignee: OSAKA UNIVERSITY, Suita-shi, Osaka (JP)

( * ) Notice: Subject to any disclaimer, the term of this patent is extended or adjusted under 35 U.S.C. 154(b) by 0 days.

(21) Appl. No.: 14/422,185

(22) PCT Filed: Aug. 1, 2013

(86) PCT No.: PCT/JP2013/070903
§ 371 (c)(1),
(2) Date: Feb. 18, 2015

(87) PCT Pub. No.: WO2014/030516
PCT Pub. Date: Feb. 27, 2014

(65) Prior Publication Data
US 2015/0214434 A1    Jul. 30, 2015

(30) Foreign Application Priority Data

Aug. 23, 2012 (JP) ................................. 2012-184347

(51) Int. Cl.
*H01L 31/0256* (2006.01)
*H01L 33/32* (2010.01)
(Continued)

(52) U.S. Cl.
CPC ......... *H01L 33/325* (2013.01); *H01L 21/0242* (2013.01); *H01L 21/0254* (2013.01);*H01L21/0262* (2013.01); *H01L 21/02458* (2013.01); *H01L 21/02581* (2013.01); *H01L 21/02639* (2013.01); *H01L 21/02647* (2013.01); *H01L 33/0075* (2013.01); *H01L 33/16* (2013.01); *H01L 33/24* (2013.01)

(58) Field of Classification Search
CPC .......... H01L 31/0256; H01L 33/0075; H01L 33/325; H01L 33/24
See application file for complete search history.

(56) References Cited

U.S. PATENT DOCUMENTS 7,135,348 B2 * 11/2006 Okuyama ............... H01L 33/24
257/190
8,409,897 B2   4/2013 Nishikawa et al.
(Continued)

FOREIGN PATENT DOCUMENTS

JP    2000 91703 A    3/2000
JP    2003-282942 A   10/2003
(Continued)

OTHER PUBLICATIONS

International Preliminary Examination Report, issued in PCT/JP2013/070903, dated Jul. 3, 2014.
(Continued)

*Primary Examiner* — Phuc Dang
(74) *Attorney, Agent, or Firm* — Birch, Stewart, Kolasch & Birch, LLP (57) ABSTRACT

A production method of a substrate for nitride semiconductor device comprising
  a mask formation step of using a metal nitride as a base material and forming a mask having a prescribed shape on the above-described base material,
  a three-dimensional structure growth step of growing a three-dimensional structure made of the same material as the base material on the base material having the mask formed thereon using a selective growth technique so that a layer having a higher index plane is formed on the lateral face, and
  an active layer growth step of growing an active layer containing a rare earth element on the lateral face of the above-described three-dimensional structure using an organometallic vapor phase epitaxial method.

20 Claims, 5 Drawing Sheets

(51) Int. Cl.
  *H01L 33/16* (2010.01)
  *H01L 21/02* (2006.01)
  *H01L 33/00* (2010.01)
  *H01L 33/24* (2010.01)

(56) References Cited

U.S. PATENT DOCUMENTS

2004/0048409 A1    3/2004   Biwa et al.
2013/0313514 A1*  11/2013   Hwang ................. H01L 33/16
                                                257/13
2014/0191187 A1*   7/2014   Zhang ................... H01L 33/24
                                                257/13

FOREIGN PATENT DOCUMENTS

JP          2006-5044 A       1/2006
WO    WO 2010/128643 A1      11/2010

OTHER PUBLICATIONS

International Search Report, issued in PCT/JP2013/070903, dated Sep. 10, 2013.

Written Opinion of the International Searching Authority, issued in PCT/JP2013/070903, dated Sep. 10, 2013.

* cited by examiner

SUBSTRATE FOR NITRIDE SEMICONDUCTOR DEVICE AND PRODUCTION METHOD THEREOF, AND RED LIGHT EMITTING SEMICONDUCTOR DEVICE AND PRODUCTION METHOD THEREOF

TECHNICAL FIELD

The present invention relates to a substrate for nitride semiconductor device and a production method thereof, and a red light emitting semiconductor device and a production method thereof. Further, the present invention relates to a nitride semiconductor device using the above-described substrate for nitride semiconductor device.

BACKGROUND ART

Nitride semiconductors such as gallium nitride (GaN) and the like are watched as a semiconductor material constituting a blue light emitting device, and recently, are expected to be able to realize a green light emitting device, further, a red light emitting device, by doping indium (In) at high concentration to GaN. When the concentration of In is higher, however, fluctuation of the In composition and the piezoelectric field effect become remarkable, thus, a red light emitting device using a nitride semiconductor has not been realized under present circumstances.

On the other hand, paying attention to wide gap of a nitride semiconductor, a semiconductor prepared by using GaN as a doping base and doping a rare earth element such as europium (Eu) and praseodymium (Pr) is regarded as promising as a red light emitting device.

Under such situation, the present inventors have led the world and succeeded in realization of a red light emitting diode (LED) using Eu or Pr-doped GaN as an active layer.

Owing to realization of such a red light emitting diode, it becomes possible to integrate light-emitting diodes of three primary colors of light using nitride semiconductors on the same substrate, combining with a blue light emitting diode and a green light emitting diode developed previously. Therefore, application thereof to fields of a compact and high-resolution full color display, LED illumination having added light emission in the red region not contained in current white LED, and the like, is expected.

PRIOR ART DOCUMENT

Patent Document (Patent document 1) WO2010/128643 A1

SUMMARY OF THE INVENTION

Problem to be Solved by the Invention

However, light output of the above-described red light emitting diode remains around 50 µW at present condition, thus, further improvement in emission intensity (light output) is required for practical use thereof.

For improving light output of a red light emitting diode, it is necessary that the Eu doping concentration is increased as much as possible.

Figure 6:
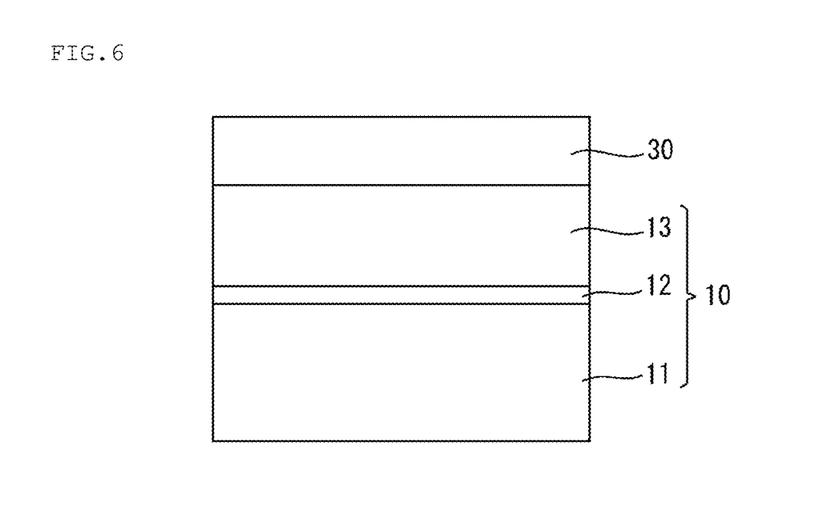
FIG. 6 is a view showing schematically the constitution of a conventional red light emitting semiconductor device.

However, since, conventionally, a GaN buffer layer 12 and an undoped GaN layer 13 are grown on the (0001) plane of a sapphire substrate 11 to fabricate a base material template 10 having a surface as the (0001) plane and the (0001) plane of a Eu-doped GaN layer 30 is grown on its surface as shown in FIG. 6, if the Eu doping concentration is increased, roughness of the crystal growth surface occurs and light output cannot be improved because the ion radius of $Eu^{3+}$ is 1.5 times larger than the ion radius of $Ga^{3+}$ to be replaced.

In contrast, if a Eu-doped GaN layer of high index plane is grown by using a base material template prepared by cutting a sapphire substrate into a higher index plane than (0001) plane and growing an undoped GaN layer having a high index plane on this, the density of connecting bonds improving an impurity doping property increases and incorporation of Eu is promoted, thus, improvement in light output can be expected. However, since such processing needs high cost, production cost of a red light emitting semiconductor device is significantly increased, thus, it cannot be used in general.

Then, the present invention has an object of providing a red light emitting semiconductor device production technique which can produce at low cost a red light emitting semiconductor device showing high emission intensity (light output), without requiring expensive processing of cutting a sapphire substrate into a high index plane.

Means for Solving the Problem

The present inventors have investigated to solve the above-described problem as described below, leading to completion of the present invention.

That is, the present inventors have considered that if a GaN layer (undoped) having a higher index plane than (0001) plane can be grown previously on a conventional cheap base material template carrying an undoped GaN layer having (0001) plane and an Eu-doped GaN layer can be grown on this, then, a Eu-doped GaN layer having a high index plane can be grown and a red light emitting semiconductor device showing high emission intensity (light output) can be produced at low cost, like the case in which a Eu-doped GaN layer is grown using a substrate having been cut into a high index plane.

As a result of investigation, it has been found that by using a selective growth technique, a GaN three-dimensional structure having a higher index plane than (0001) plane formed on the lateral face can be grown on an undoped GaN layer having (0001) plane, and if a Eu-doped GaN layer is grown utilizing this high index plane at the lateral face, the Eu doping concentration can be improved by utilizing an impurity doping property specific to the high index plane and high light output can be obtained.

Figure 1:
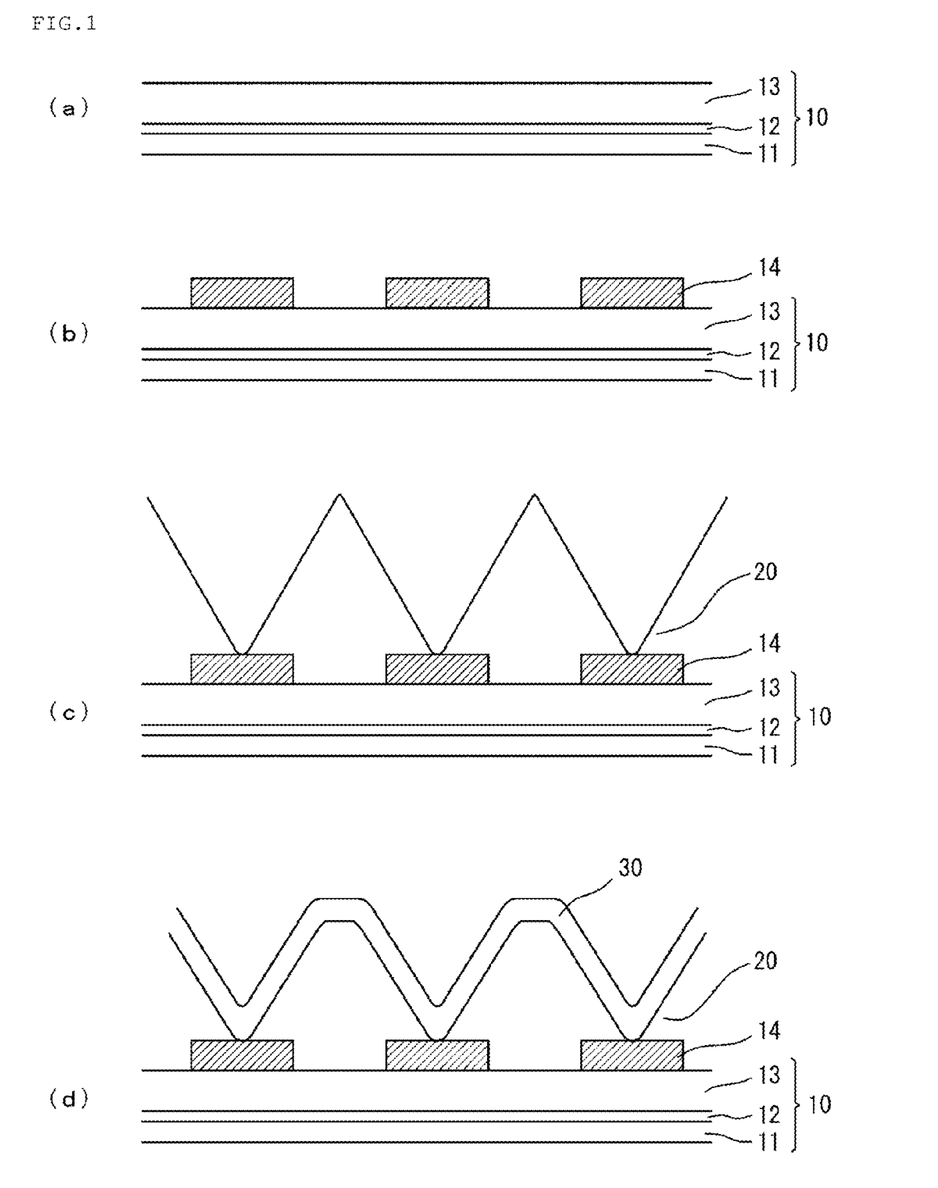
FIG. 1 is a view illustrating schematically a production step of a red light emitting semiconductor device according to the present invention.

Specifically, as shown in FIG. 1, a $SiO_2$ mask layer 14 (FIG. 1(*b*)) was provided on the surface of a conventional base material template 10 (FIG. 1(*a*)) prepared by growing a GaN buffer layer 12 and an undoped GaN layer 13 on the (0001) plane of a sapphire substrate 11, then, a GaN three-dimensional structure 20 was grown on the undoped GaN layer 13 and the $SiO_2$ mask layer 14 (selective growth technique) (FIG. 1(*c*)).

Figure 2:
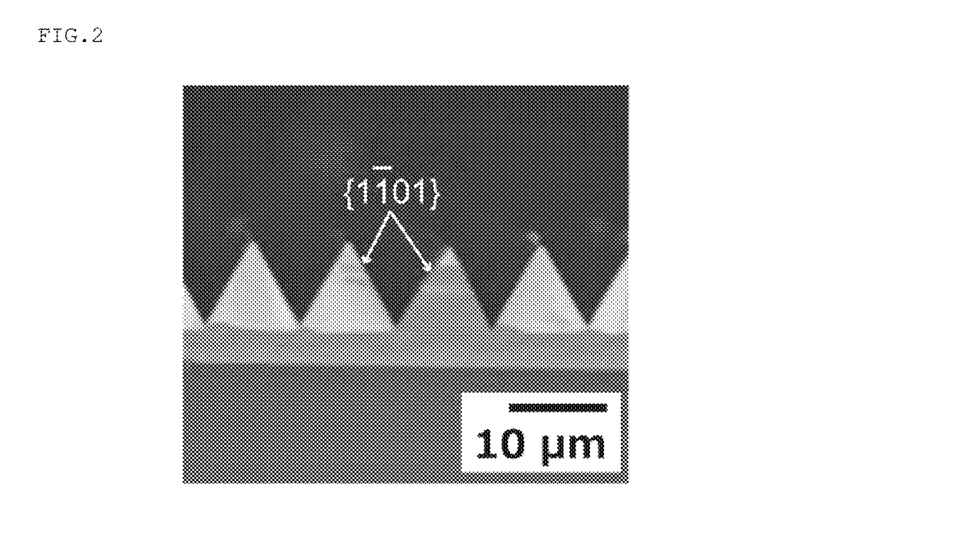
FIG. 2 is a scanning electron micrograph of the cross section of a GaN three-dimensional structure formed by a selective growth technique.

It has been confirmed that {1-101} facet face which is a higher index plane than the (0001) plane of the undoped GaN layer 13 is formed on the lateral face of this GaN three-dimensional structure 20 (FIG. 2).

Since red emission of Eu cannot be obtained if both Si and Eu are doped, the GaN three-dimensional structure 20 was grown until the $SiO_2$ mask layer 14 is covered completely in the above-described constitution.

It has been confirmed that if a Eu-doped GaN layer 30 having {1-101} face is grown on the {1-101} facet face formed on the lateral face of this GaN three-dimensional structure 20, light output is improved than ever before.

Thereafter, the present inventors have further carried out various experiments and investigation on preferable conditions for growing a Eu-doped GaN layer on the {1-101} facet face of the GaN three-dimensional structure described above, to obtain an unexpected result that the growth face of a Eu-doped GaN layer varies significantly and light output is improved dramatically by a slight difference in the growth temperature.

Figure 3:
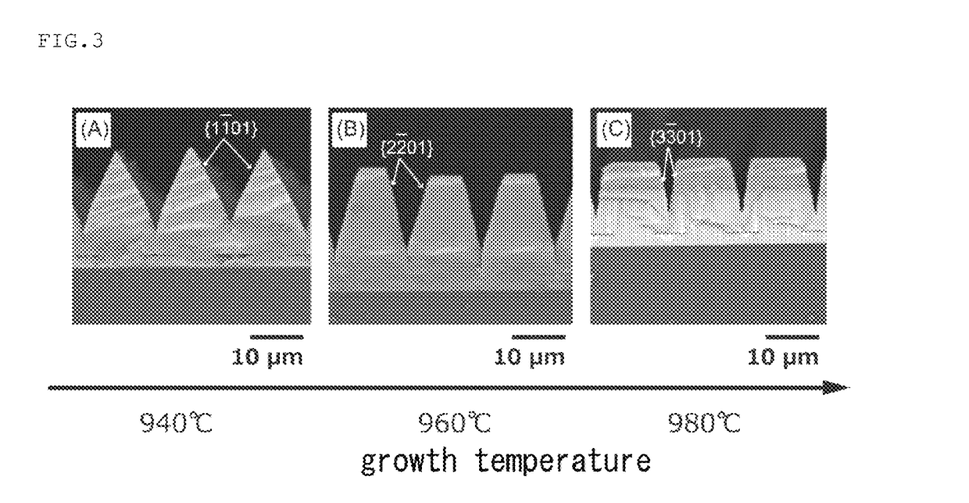
FIG. 3 is a scanning electron micrograph of a Eu-doped GaN layer formed in a production method of a red light emitting semiconductor device according to the present invention.

Namely, while the same {1-101} face as the lateral face of the GaN three-dimensional structure 20 is formed when the growth temperature is 940° C., a {2-201} face is formed at 960° C. and a {3-301} face is formed at 980° C. That is, a facet face having a higher index than the lateral face of the GaN three-dimensional structure 20 was formed by only slightly varying the growth temperature, as shown in FIG. 3.

The reason for this is speculated that a different index plane is formed since the growth mode of a Eu-doped GaN layer changes according variation of the growth temperature in addition to a decrease in the growth rate due to doping of Eu.

Further, it has been found that light output at such a {2-201} face and a {3-301} face of a Eu-doped GaN layer is improved dramatically as compared with light output at the {1-101} described above.

As described above, the present inventors have found that a red light emitting semiconductor device showing improved light output than ever before can be provided by growing a GaN three-dimensional structure having a lateral face of high index plane on undoped GaN on a base material by applying a selective growth technique, then, growing a Eu-doped GaN layer while regulating growth conditions on the high index plane of this GaN three-dimensional structure.

The reason for the improvement in light output described above is supposed that by growing a Eu-doped GaN layer having a high index plane, the density of connecting bonds increases as described above, and additionally, growth progresses to a direction which is parallel to a substrate and vertical to the stripe direction, as a result, a Eu-doped GaN layer not bound to the substrate grows on a $SiO_2$ mask, and the Eu-doped GaN layer deforms to relax strain ascribable to Eu having large ion radius, and incorporation of Eu is promoted (namely, Eu doping concentration increases), causing improvement in light output.

Since it becomes possible to integrate light-emitting diodes of "red•green•blue" three primary colors of light at practical level by realizing a red light emitting diode excellent in a device property of high light output, a full color display using a compact, high-resolution and high-output light-emitting diode can be realized.

Further, by adding light emission of high intensity in the red region not contained in current white LED, high-luminance LED illumination is made possible which not only replaces AlGaInP type LED currently used as red LED but also uses such a property of a rare earth element that the emission wavelength does not vary depending on the ambient temperature.

Though (0001) plane is mentioned as a face to which a selective growth technique is applied in the above-described explanation, the face is not limited to (0001) plane, and the same effect as described above can be obtained even if the face is the other index plane.

Though GaN is mentioned as a base material and Eu is mentioned as a doped element in the above-described explanation, the base material is not limited to GaN and the same effect as described above can be obtained even if InN, AlN or a mixed crystal thereof (InGaN, AlGaN and the like) is used as the base material, as described in Patent document 1.

Also the doped element is not limited to Eu, and the same effect as described above can be obtained even if Pr is used as the doped element. The doped element is not limited to Eu and may also be Pr since the outer shell electron is screened by a core electron, light emission occurring in intra-shell transition has a wavelength of 590 nm or more, and this is not restricted to the NTSC color gamut and the HDTV color gamut and reveals reddish light.

As described above, the present inventors have found that a red light emitting semiconductor device showing more improved light output can be provided at low cost by growing a GaN three-dimensional structure having a lateral face of high index plane on undoped GaN of a base material by applying a selective growth technique, then, growing a Eu-doped GaN layer on the high index plane of this GaN three-dimensional structure, in fabrication of a red light emitting semiconductor device. Further, it has been found that a Eu-doped GaN layer having a plane of various high indices can be obtained by changing the growth conditions of the Eu-doped GaN layer such as the growth temperature and the like.

The present inventors have found that the semiconductor device fabricated by these technologies is not limited to use as the red light emitting semiconductor device described above, and can be preferably used as a substrate in fabricating other nitride semiconductor devices.

Nitrides such as GaN, InN and the like have large wide gap, and a nitride semiconductor device suitable for various uses can be provided by utilizing this wide gap. However, for allowing a property suitable for the use to be exerted sufficiently, it is necessary to form a nitride layer having an index plane corresponding to its property, particularly, a high index plane on a substrate.

On the other hand, the present inventors have found, in investigation of the technology for improving light output of a red light emitting semiconductor device which is a kind of nitride semiconductor device, that a Eu-doped GaN layer having a desired high index plane can be formed at low cost by growing a GaN three-dimensional structure having a lateral face of high index plane by applying a selective growth technique and growing a Eu-doped GaN layer on the high index plane of the GaN three-dimensional structure.

That is, it has been succeeded to obtain an unexpected result that if a GaN three-dimensional structure having a higher index plane than (0001) plane formed on the lateral face is grown on an undoped GaN layer having (0001) plane by applying a selective growth technique and a Eu-doped GaN layer is grown by utilizing this high index plane at the lateral face, then, a Eu-doped GaN layer having a high index plane can be grown by regulating growth conditions thereof.

As a result, by regulating the growth conditions of an active layer using the above-described technology, a GaN layer having a desired index plane over a wider range can be obtained and a substrate for nitride semiconductor device having properties suitable for various uses can be obtained.

Further, it is believed that an active layer having a desired high index plane is obtained not only by regulation of the growth conditions of the active layer but also by regulation of the growth conditions in selective growth.

Since basic chemical properties and vapor pressure of Eu do not significantly vary also in other rare earth elements, a high index plane can be grown likewise even if other rare earth elements are used instead of Eu and a high index plane can be grown likewise even if other nitride layers are used instead of a GaN layer.

Though the shape and size of a mask to be formed on a base material can be appropriately set, when it is necessary to avoid an influence by doping of Si together with rare earth elements such as in the above-described case of doping of Si together with Eu, it is preferable to grow a three-dimensional structure so that the mask is completely covered.

In contrast, an influence by doping of Si together with rare earth elements may be utilized such as in a case wherein a three-dimensional structure is grown without being completely covered by a mask, and Si is intentionally doped to an active layer, to prevent light emission of the active layer, and the like.

Also, an influence by doping of Si together with rare earth elements may be utilized such as in a case wherein complete covering with a mask is attained, then, Si is intentionally doped together with rare earth elements in growing a three-dimensional structure, to prevent light emission of an active layer, and the like.

The substrate for nitride semiconductor device fabricated as described above can be provided at low cost since processing for previously cutting a high index plane and the like are not necessary.

Inventions according to Claims 1 to 20 are inventions based on the above-described findings.

That is, the invention according to Claim 1 is a production method of a substrate for nitride semiconductor device using a metal nitride, comprising a mask formation step of using a metal nitride as a base material and forming a mask having a prescribed shape on the above-described base material, a three-dimensional structure growth step of growing a three-dimensional structure made of the same material as the above-described base material on the above-described base material having the mask formed thereon using a selective growth technique so that a layer having a higher index plane than the above-described base material is formed on the lateral face, and an active layer growth step of growing an active layer containing a rare earth element doped so as to replace a metal element of the above-described metal nitride on the lateral face of the above-described three-dimensional structure using an organometallic vapor phase epitaxial method, wherein the active layer having a desired high index plane is grown by regulating the growth conditions of the active layer in the above-described active layer growth step.

In the invention of this claim, the active layer having a desired high index plane can be grown by regulating the growth conditions in growing the active layer, and a nitride semiconductor device having properties suitable for various uses can be produced at low cost by using the substrate for nitride semiconductor device in which the active layer having a high index plane has been grown as described above.

The invention according to Claim 2 is a production method of a substrate for nitride semiconductor device using a metal nitride, comprising a mask formation step of using a metal nitride as a base material and forming a mask having a prescribed shape on the above-described base material, a three-dimensional structure growth step of growing a three-dimensional structure made of the same material as the above-described base material on the above-described base material having the mask formed thereon using a selective growth technique so that a layer having a higher index plane than the above-described base material is formed on the lateral face, and an active layer growth step of growing an active layer containing a rare earth element doped so as to replace a metal element of the above-described metal nitride on the lateral face of the above-described three-dimensional structure using an organometallic vapor phase epitaxial method, wherein the active layer having a desired high index plane is formed on the lateral face of the above-described three-dimensional structure by regulating the growth conditions of the three-dimensional structure.

The active layer having a desired high index plane can be formed also by regulating the conditions for growing the three-dimensional structure in which the layer having a higher index plane than the base material has been formed on the lateral face, and a nitride semiconductor device having properties suitable for various uses can be produced at low cost by using the substrate for nitride semiconductor device in which the active layer having a high index plane has been grown as described above.

The invention according to Claim 3 is a production method of a substrate for nitride semiconductor device according to Claim 2, wherein the active layer having a desired high index plane is grown by regulating the growth conditions of the active layer in the above-described active layer growth step.

The active layer having a higher index plane can be grown by regulating the growth conditions in growing the active layer together with regulating the conditions for growing the three-dimensional structure.

The invention according to Claim 4 is a production method of a substrate for nitride semiconductor device according to Claim 1 or 3, wherein regulation of the growth conditions of the above-described active layer is conducted by the growth temperature.

The invention according to Claim 5 is a production method of a substrate for nitride semiconductor device according to Claim 2 or 3, wherein regulation of the growth conditions of the above-described three-dimensional structure is conducted by the growth temperature.

Since the growth temperature can be regulated easily in regulation of the growth conditions of the active layer and regulation of the growth conditions of the three-dimensional structure, it is preferable as a method for regulating the growth conditions.

The invention according to Claim 6 is a production method of a substrate for nitride semiconductor device according to any one of Claims 1 to 5, wherein the above-described mask is a mask made of $SiO_2$, and the above-described three-dimensional structure is grown so as to cover the above-described mask completely.

As the mask material, $SiO_2$, SiN and the like can be used, and a $SiO_2$ mask material is preferable since it is cheap and easily available.

Though the shape and size of the mask to be formed on the base material can be appropriately set, when it is necessary to avoid an influence by doping of Si together with rare earth elements such as in the above-described case of doping of Si together with Eu, it is preferable to grow the three-dimensional structure so that the mask is completely covered.

The invention according to Claim 7 is a production method of a substrate for nitride semiconductor device according to any one of Claims 1 to 5, wherein the above-described mask is a mask made of $SiO_2$, the above-described three-dimensional structure is grown so as not to cover the above-described mask completely, and Si is intentionally doped to the active layer.

The properties of the active layer can be regulated widely by utilizing an influence by doping of Si together with rare earth elements such as in a case wherein the three-dimensional structure is grown under condition of no complete covering with the mask and partial exposure, and Si is intentionally doped to the active layer, to prevent light emission of the active layer, and the like.

The invention according to Claim 8 is a production method of a substrate for nitride semiconductor device according to any one of Claims 1 to 5, wherein the above-described mask is a mask made of $SiO_2$, the above-described three-dimensional structure is grown so as to cover the above-described mask completely, then, Si is intentionally doped.

The properties of the active layer can be regulated widely also by utilizing an influence by doping of Si together with rare earth elements such as in a case wherein the three-dimensional structure is grown so as the cover the mask completely, then, Si is intentionally doped to the active layer, to prevent light emission of the active layer, and the like.

The invention according to Claim 9 is a production method of a substrate for nitride semiconductor device according to any one of Claims 1 to 8, wherein the above-described metal nitride is GaN.

Of metal nitrides forming a nitride semiconductor, GaN is generally used, therefore, the growth conditions thereof are well-known already, and GaN is available at low cost.

The invention according to Claim 10 is a production method of a substrate for nitride semiconductor device according to any one of Claims 1 to 9, wherein the rare earth element to be doped in the above-described active layer growth step is Eu.

Eu is used also in production of the above-described red light emitting semiconductor device. Therefore, the growth conditions of the active layer are well known already, and Eu is available at low cost.

The invention according to Claim 11 is a production method of a substrate for nitride semiconductor device according to any one of Claims 1 to 10, wherein the method comprises a mask step of masking the above-described active layer formed.

The active layer sometimes exerts an influence on a nitride semiconductor such as in a case wherein the active layer shows red emission when the nitride semiconductor is formed on a substrate for nitride semiconductor device having a Eu-doped GaN layer as the active layer, for example. When such a possibility exists, the influence of the active layer on the nitride semiconductor can be prevented by masking the active layer.

As the mask, $SiO_2$, SiN and the like described above can be used.

The invention according to Claim 12 is a substrate for nitride semiconductor device fabricated by using a production method of a substrate for nitride semiconductor device according to any one of Claims 1 to 11.

The invention according to Claim 13 is a substrate for nitride semiconductor device using a metal nitride fabricated by using a production method of a substrate for nitride semiconductor device, comprising
a mask formation step of using a metal nitride as a base material and forming a mask having a prescribed shape on the above-described base material,
a three-dimensional structure growth step of growing a three-dimensional structure made of the same material as the above-described base material on the above-described base material having the mask formed thereon using a selective growth technique so that a layer having a higher index plane than the above-described base material is formed on the lateral face, and
an active layer growth step of growing an active layer containing a rare earth element doped so as to replace a metal element of the above-described metal nitride on the lateral face of the above-described three-dimensional structure using an organometallic vapor phase epitaxial method,
wherein the active layer having a desired high index plane is grown by regulating the growth conditions of the active layer in the above-described active layer growth step.

The invention according to Claim 14 is a substrate for nitride semiconductor device using a metal nitride fabricated by
using a production method of a substrate for nitride semiconductor device, comprising
a mask formation step of using a metal nitride as a base material and forming a mask having a prescribed shape on the above-described base material,
a three-dimensional structure growth step of growing a three-dimensional structure made of the same material as the above-described base material on the above-described base material having the mask formed thereon using a selective growth technique so that a layer having a higher index plane than the above-described base material is formed on the lateral face, and
an active layer growth step of growing an active layer containing a rare earth element doped so as to replace a metal element of the above-described metal nitride on the lateral face of the above-described three-dimensional structure using an organometallic vapor phase epitaxial method,
wherein the active layer having a desired high index plane is formed on the lateral face of the above-described three-dimensional structure by regulating the growth conditions of the three-dimensional structure.

A substrate for nitride semiconductor device in which an active layer having a desired high index plane has been grown can be provided at low cost, by using the above-described production methods.

The invention according to Claim 15 is a nitride semiconductor device fabricated by using a substrate for nitride semiconductor device according to any one of Claims 12 to 14.

Since a cheap substrate for nitride semiconductor device is used, a nitride semiconductor device suitable for various uses can be provided easily at low cost. Especially, the present invention is suitable for a light emitting semiconductor device.

The invention according to Claim 16 is a production method of a red light emitting semiconductor device using GaN, InN, AlN or a mixed crystal composed of any two or more of them, comprising
a mask formation step of using GaN, InN, AlN or a mixed crystal composed of any two or more of them as a base material and forming a mask having a prescribed shape on the above-described base material,
a three-dimensional structure growth step of growing a three-dimensional structure made of the same material as the above-described base material on the above-described base material having the above-described mask formed thereon using a selective growth technique so that a layer having a higher index plane than the above-described base material is formed on the lateral face, and an active layer growth step of growing an active layer containing Eu or Pr doped so as to replace Ga, In or Al on the lateral face of the above-described three-dimensional structure using an organometallic vapor phase epitaxial method.

In the invention of this claim, a layer having a higher index plane than the base material can be formed on the lateral face of the three-dimensional structure, by providing the mask on the base material and growing the three-dimensional structure made of the same material as the base material using a selective growth technique.

A red light emitting semiconductor device showing high light output can be obtained by growing the active layer such as a Eu-doped GaN layer and the like on the high index plane formed on the lateral face of the three-dimensional structure using an organometallic vapor phase epitaxial method (OM-VPE method).

The invention according to Claim 17 is a production method of a red light emitting semiconductor device according to Claim 16, wherein the above-described mask is a mask made of $SiO_2$, and the above-described three-dimensional structure is grown so as to cover the above-described mask completely.

As the mask material, $SiO_2$, SiN and the like can be used, and a $SiO_2$ mask material is preferable since it is cheap and easily available.

Though the shape and size of the mask to be formed on the base material can be appropriately set, when Si is doped together with Eu, red emission cannot be obtained, therefore, it is preferable to grow the three-dimensional structure so that the mask is completely covered, as described above.

The invention according to Claim 18 is a production method of a red light emitting semiconductor device according to Claim 16 or 17, wherein the above-described active layer having a desired index plane is grown in the above-described active layer growth step by regulating the growth temperature.

The present inventors have obtained an unexpected result that when an active layer such as a Eu-doped GaN layer or the like is grown on the lateral face of the three-dimensional structure formed, the growth face of the active layer varies significantly and light output is improved dramatically by a slight difference in the growth temperature, as described above.

This result teaches that if the three-dimensional structure is grown by applying a selective growth technique based in the index plane of the base material and, further, the active layer containing Eu and Pr doped is grown on the lateral face of the three-dimensional structure, then, the active layer having a desired index plane over a wide range is obtained by only slightly regulating the growth temperature. By growing the active layer having a desired index plane as described above, a desired red light emitting semiconductor device showing high light output can be obtained.

To inventors' knowledge, such findings are not known yet.

Though it is envisaged to vary the growth mode of the active layer by other regulation methods in addition to variation of the growth mode of the active layer by regulating the growth temperature, regulation of the growth temperature is preferable as a method of regulating the growth mode of the active layer since the growth temperature can be easily regulated.

The invention according to Claim 19 is a production method of a red light emitting semiconductor device according to any one of Claims 16 to 18, wherein the element doped in the above-described active layer growth step is Eu.

Eu is more preferable as the doped element since Eu shows higher red emission efficiency as compared with Pr. Also, Eu has past record as a red fluorescent substance of color television, and Eu is available more easily as compared with Pr.

Specific Eu sources include, for example, Eu compounds represented by the general formula: $Eu[C_5 (CH_3)_4R]_2$ (R: alkyl group) such as $Eu[C_5 (CH_3)_5]_2$ and the like; $Eu[C_5 (CH_3)_4H]_2$, $Eu\{N[Si(CH_3)_3]_2\}_3$, $Eu(C_5H_7O_2)_3$, $Eu(C_{11}H_{19}O_2)_3$ and the like, and of them, $Eu\{N[Si(CH_3)_3]_2\}_3$ and $Eu(C_{11}H_{19}O_2)_3$ are preferable since the vapor pressure thereof in a reaction apparatus is high and efficient doping is possible.

The invention according to Claim 20 is a red light emitting semiconductor device fabricated by using a production method of a red light emitting semiconductor device according to any one of Claims 16 to 19.

By using the above-described production methods, a red light emitting semiconductor device showing light output improved as compared with conventional red light emitting semiconductor devices can be provided, and large economic effects can be provided such as application to the above-described light-emitting diode of "red•green•blue" three primary colors of light, compact and high-resolution full color displays, high-luminance LED illumination, and the like.

EFFECT OF THE INVENTION

According to the present invention, a substrate for nitride semiconductor device and a nitride semiconductor device having a desired index plane can be provided easily and at low cost, and a red light emitting semiconductor device showing high emission intensity (light output) can be provided at low cost.

MODES FOR CARRYING OUT THE INVENTION

The present invention will be illustrated specifically by examples mentioned below.

1. Production of Red Light Emitting Semiconductor Device

FIG. 1 is a view showing schematically a production step of a red light emitting semiconductor device according to the present embodiment, and 10 is a base material template and constituted of a sapphire substrate 11, a GaN buffer layer 12 and an undoped GaN layer 13, and 14 is a $SiO_2$ mask layer.

(1) Fabrication of Base Material Template

First, a (0001) plane sapphire having a thickness of 430 μm was prepared, immersed in an organic solvent and ultrasonically washed. Further, the substrate 11 is immersed in and washed with washing liquid prepared by mixing hydrochloric acid and ultrapure water, ammonia water, and ultrapure water, in this order.

Next, the sapphire substrate 11 was set in a MOVPE apparatus, and a GaN buffer layer 12 and an undoped GaN layer 13 were grown on the (0001) plane of the sapphire substrate 11.

Specifically, the sapphire substrate 11 was introduced into a pass box and the atmosphere was purged with a nitrogen gas. Then, the sapphire substrate 11 was mounted on a quartz susceptor tray in a glove box, and set on a susceptor of a quartz reaction tube.

Thereafter, a purified hydrogen gas was introduced into the quartz reaction tube, the pressure was kept at atmospheric pressure. The sapphire substrate 11 was heated up to 475° C. while flowing an ammonia ($NH_3$) gas, and trimethylgallium (TMGa) was fed, to grow a GaN buffer layer 12 for 85 seconds.

Thereafter, further, the sapphire substrate 11 was heated up to 1150° C., and an undoped GaN layer 13 was grown for 30 minutes, to fabricate a base material template 10 shown in FIG. 1(a).

Instead of the above-described procedure, a commercially available base material template having the above-described structure formed previously may also be used.

(2) Formation of Mask Layer

Next, the fabricated base material template 10 was taken out from the MOVPE apparatus. Then, a $SiO_2$ mask layer 14 having a thickness of 100 nm was formed on the undoped GaN layer 13, using an electron beam vapor-deposition technique, to fabricate a substrate for selective growth shown in FIG. 1(b).

Specifically, windows of the photoresist in the form of stripe having a width of 5 μm along the <11-20> direction to the undoped GaN layer 13 were formed at an interval of 5 μm using photolithography. Then, the $SiO_2$ mask layer 14 was etched by hydrofluoric acid, to fabricate a substrate for selective growth.

(3) Formation of GaN Three-dimensional Structure

The fabricated substrate for selective growth was introduced into the reaction tube of the MOVPE apparatus, and a GaN three-dimensional structure 20 as shown in FIG. 1(c) was grown by a selective growth technique while feeding $NH_3$ and TMGa under atmospheres of a growth pressure of 70 kPa and a growth temperature of 960° C.

Under this constitution, if Si is doped to a Eu-doped GaN layer in the subsequent step of forming a Eu-doped GaN layer, light emission becomes impossible. Therefore, it is necessary to grow the GaN three-dimensional structure 20 so that the undoped GaN layer 13 and the $SiO_2$ mask layer 14 are completely covered by the GaN three-dimensional structure 20.

In this example, the $SiO_2$ mask layer 14 was covered completely by the GaN three-dimensional structure 20 by effecting growth of the GaN three-dimensional structure 20 in the following three stages divided. That is, $NH_3$ was fed at 1.5 slm and TMGa was fed at 1.03 sccm in first 0.5 hours, $NH_3$ was fed at 3.0 slm and TMGa was fed at 2.06 sccm in next 0.5 hours, and $NH_3$ was fed at 4.5 slm and TMGa was fed at 3.09 sccm in last 1.0 hour, to carry out growth of the GaN three-dimensional structure 20.

The cross section of the grown GaN three-dimensional structure 20 was observed by a scanning electron microscope, to confirm that {1-101} facet face was formed on the lateral face of the GaN three-dimensional structure 20 and the $SiO_2$ mask layer 14 was covered completely, as shown in FIG. 2.

(4) Formation of Eu-doped GaN Layer

Next, TMGa was fed at 1.03 sccm and $Eu(DPM)_3$ (tris-dipivaloylmethanato-europium) was fed with hydrogen as a carrier gas at a carrier gas flow rate of 1.5 slm to the reaction tube while flowing 1.5 slm of $NH_3$ to the reaction tube and keeping the temperature at 150° C. under a growth pressure of 70 kPa. Under this condition, a Eu-doped GaN layer 30 was allowed to grow on the {1-101} facet face of the GaN three-dimensional structure 20 for 40 minutes, to obtain a red light emitting semiconductor device shown in FIG. 1(d).

In each example, this procedure was conducted at one of three different growth temperatures. That is, a Eu-doped GaN layer was grown at a growth temperature of 940° C. to obtain a red light emitting semiconductor device of Example 1, a Eu-doped GaN layer was grown at a growth temperature of 960° C. to obtain a red light emitting semiconductor device of Example 2 and a Eu-doped GaN layer was grown at a growth temperature of 980° C. to obtain a red light emitting semiconductor device of Example 3.

The respective cross sections of the formed Eu-doped GaN layers 30 were observed by a scanning electron microscope, to find that the {1-101} facet face on the lateral face emerged on the GaN three-dimensional structure 20 was kept during the growth in Example 1 (growth temperature 940° C.), as shown in FIG. 3.

In contrast, in Example 2 (growth temperature 960° C.), it was found that the inclination of the lateral face of the GaN three-dimensional structure 20 increased to about 75° due to doping of Eu and {2-201} facet face of higher index emerged, though the Eu-doped GaN layer 30 was grown at the same growth temperature as the growth temperature of the GaN three-dimensional structure 20.

Further, in the case of Example 3 (growth temperature 980° C.), it was found that the inclination of the lateral face of the GaN three-dimensional structure 20 increased further to about 80° and {3-301} facet face of further higher index emerged.

As shown in FIG. 3, in any of Example 2 (growth temperature 960° C.) and Example 3 (growth temperature 980° C.), (0001) plane emerged at the leading end portion of the GaN three-dimensional structure 20.

Figure 4:
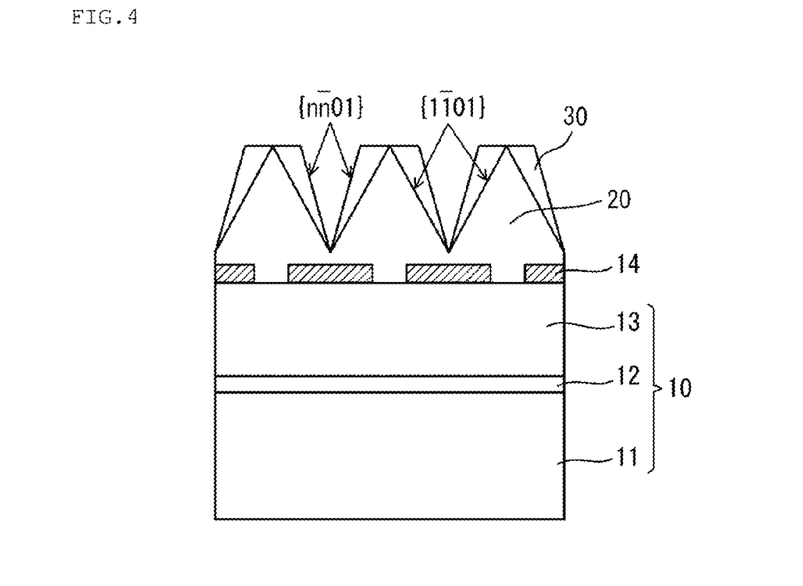
FIG. 4 is a view showing schematically the constitution of a red light emitting semiconductor device according to the present invention.

From the above described results, it is confirmed that by forming a GaN three-dimensional structure by applying a selective growth technique, {1-101} facet face as a higher index plane than (0001) plane can be formed on the lateral face thereof, and {2-201} facet face and {3-301} facet face as further higher index planes can be easily formed only by slightly regulating temperature by doping of Eu, and by changing the growth conditions in forming a Eu-doped GaN layer, {n-n01} face 30 is formed on the {1-101} lateral face of the GaN three-dimensional structure 20 as shown in FIG.

4. Thus, it is understood that active layers of various index planes can be formed on the lateral face of the GaN three-dimensional structure.

2. Evaluation of Light Output (Photoluminescence)

Figure 5:
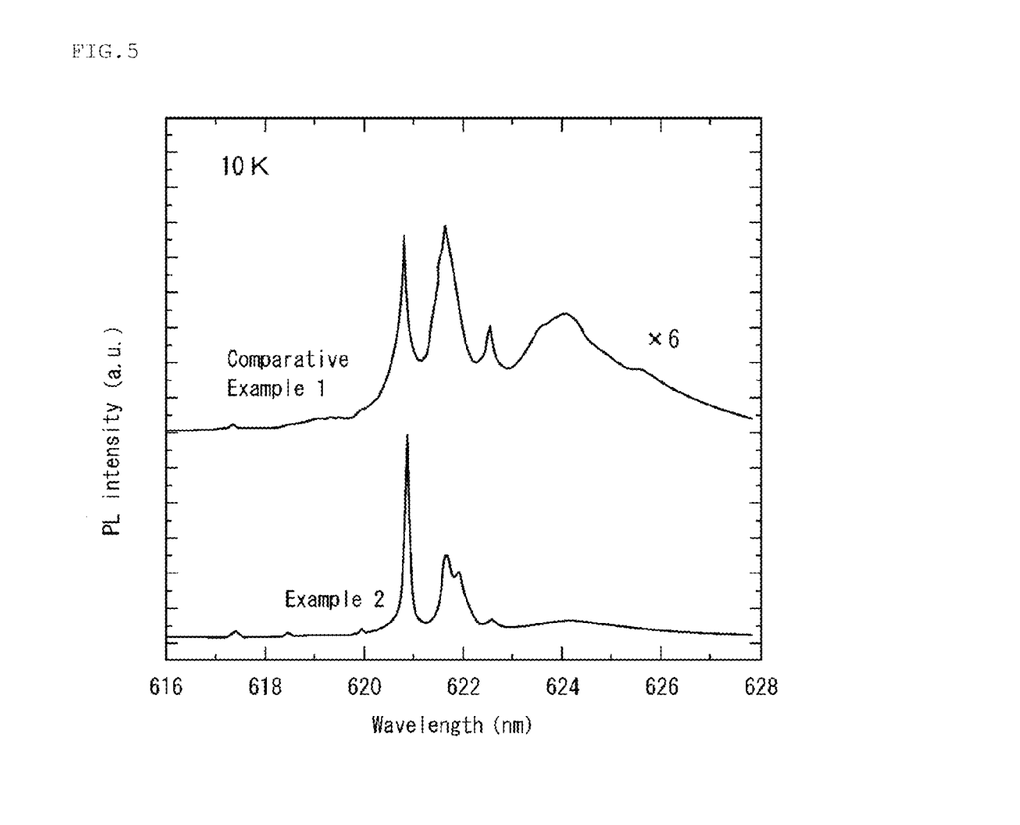
FIG. 5 is a view showing an example of the measurement results of photoluminescence of a red light emitting semiconductor device.

For the red light emitting semiconductor device of Example 2, photoluminescence (PL) measurement by He—Cd laser excitation was carried out (10 K). The measurement results are shown in FIG. 5. In FIG. 5, the abscissa axis denotes wavelength (nm) and the ordinate axis denotes PL intensity (a.u.).

A red light emitting semiconductor device was fabricated as Comparative Example 1 by a conventional method, namely by growing a Eu-doped GaN layer 30 on a flat undoped GaN layer 13 of a base material template as shown in FIG. 6 and subjected to the same measurement. The result is shown in FIG. 5 together.

From FIG. 5, it is understood that the red light emitting semiconductor device of Example 2 and the red light emitting semiconductor device of Comparative Example 1 differ in spectrum form, and also in the intensity ratio of peaks of red emission showing luminescent center of Eu. Namely, it is understood that in the red light emitting semiconductor device of Example 2, one peak is dominant, and the PL intensity (light output) is fairly improved as compared with the red light emitting semiconductor device of Comparative Example 1.

Such dominance of one peak teaches that while lot of luminescent centers exist in the red light emitting semiconductor of Comparative Example 1, easiness of formation of luminescent centers is influenced by using a high index plane as in the red light emitting semiconductor device of Example 2 and formation of luminescent centers is suppressed.

The reason for this is supposed that efficiency of energy transfer to a luminescent center is different between the red light emitting semiconductor device of Example 2 and the red light emitting semiconductor device of Comparative Example 1, and each specific luminescent center is preferentially exited.

Further, in FIG. 5, shift to the longer wavelength side of the wavelength of a peak, showing relaxation of strain around a Eu atom, is also observed.

The reason for this is supposed that, between the red light emitting semiconductor device of Example 2 and the red light emitting semiconductor device of Comparative Example 1, a difference occurs in the state of strain around the surface due to different crystal face orientations of the surface and the local structure around Eu changes, resultantly, a difference is made in the level of the $Eu^{3+}$ ion, thereby generating the above-described peak shift.

3. Evaluation of Influence of $SiO_2$ Mask Layer

An influence on red emission by whether a $SiO_2$ mask layer 14 is covered by a GaN three-dimensional structure 20 or not in forming a Eu-doped GaN layer 30 was evaluated by the X-ray absorption near-edge structure spectrum.

Figure 7:
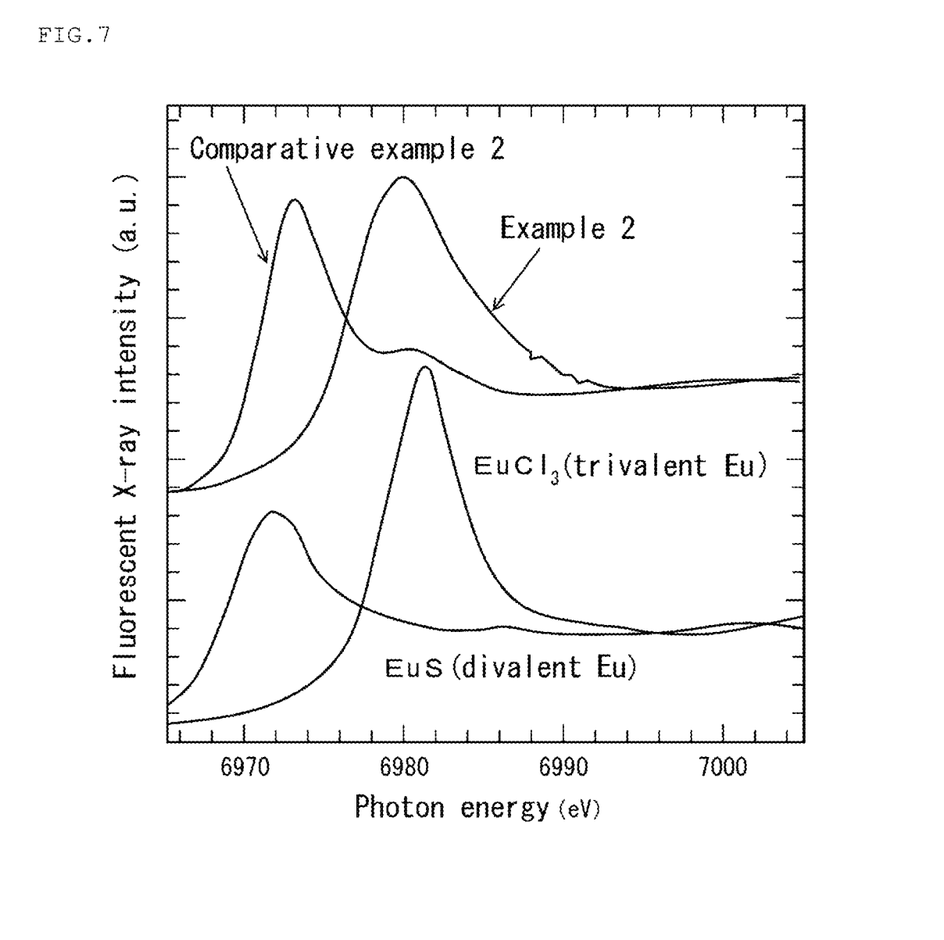
FIG. 7 is a view showing an example of the measurement results of the X-ray absorption near-edge structure spectrum of a red light emitting semiconductor device.

Specifically, the X-ray absorption near-edge structure spectrum was measured using the red light emitting semiconductor device of Example 2 in the same manner as described above. The measurement results are shown in FIG. 7. In FIG. 7, the abscissa axis denotes photon energy (eV), and the ordinate axis denotes fluorescent X-ray intensity (a.u.).

Figure 8:
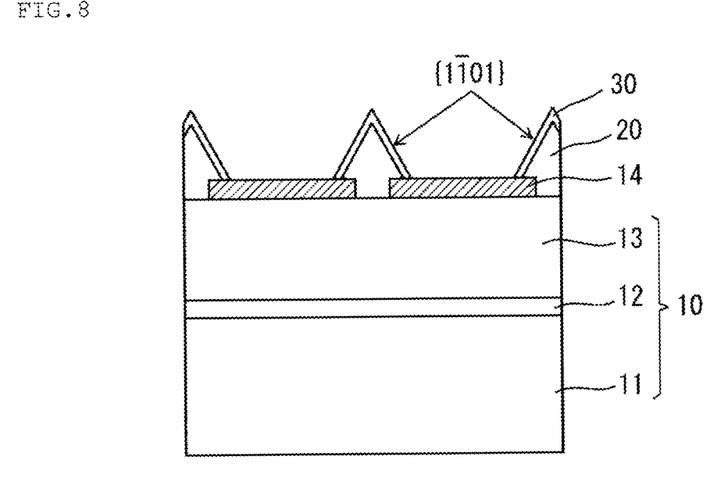
FIG. 8 is view showing schematically the constitution of a red light emitting semiconductor device in which a $SiO_2$ mask layer is not covered completely.

A red light emitting semiconductor device was fabricated as Comparative Example 2 by forming a Eu-doped GaN layer 30 on a GaN three-dimensional structure 20 in which a $SiO_2$ mask layer 14 is not covered completely by the GaN three-dimensional structure 20 as shown in FIG. 8 and subjected to the same measurement, and the result is shown in FIG. 7 together.

From FIG. 7, it is understood that in Comparative Example 2, Eu is doped as a divalent Eu ion since an absorption peak is present at the same energy position as EuS having a divalent Eu ion. This teaches that Si of a $SiO_2$ mask layer 14 is mixed in a Eu-doped GaN layer 30. Therefore, in this structure, red emission is not observed due to divalent Eu not causing red emission, when photoluminescence is measured.

In contrast, in the case of Example 2, it is understood that Eu is doped as a trivalent Eu ion since an absorption peak is present at the same energy position as $EuCl_3$ having a trivalent Eu ion and it is understood that mixing of Si into a Eu-doped GaN layer 30 is prevented by covering a $SiO_2$ mask layer 14 with a GaN three-dimensional structure 20. This is understood also from red emission observed in photoluminescence shown in FIG. 5.

From this result, necessity of formation of a GaN three-dimensional structure by completely covering a $SiO_2$ mask layer is understood.

As described above, a red light emitting semiconductor device showing more improved light output can be obtained at low cost by growing a GaN three-dimensional structure having the lateral face of high index plane on undoped GaN of a base material, then, growing a Eu-doped GaN layer on the high index plane of this GaN three-dimensional structure, by applying the present invention.

By applying this technology to production of a substrate for nitride semiconductor device, a substrate for nitride semiconductor device having an active layer of a desired index plane over a wide range can be obtained. As a result, a nitride semiconductor device having properties suitable for various uses can be provided at low cost.

The present invention has been explained based on embodiments, but the present invention is not limited to the above-described embodiments. It is possible to make various alterations of the above-described embodiments in the range which is the same as and equivalent to the present invention.

DESCRIPTION OF THE REFERENCE SIGNS

10 Base material template
11 Sapphire substrate
12 GaN buffer layer
13 Undoped GaN layer
14 $SiO_2$ mask layer
20 GaN three-dimensional structure
30 Eu-doped GaN layer

What is claimed is:

1. A production method of a substrate for nitride semiconductor device using a metal nitride, comprising
   a mask formation step of using a metal nitride as a base material and forming a mask having a prescribed shape on the above-described base material,
   a three-dimensional structure growth step of growing a three-dimensional structure made of the same material as the above-described base material on the above-described base material having the mask formed thereon using a selective growth technique so that an undoped layer having a higher index plane than the above-described base material is formed on the lateral face, and
   an active layer growth step of growing an active layer containing a rare earth element doped so as to replace a metal element of the above-described metal nitride on the undoped layer on the lateral face of the above-described three-dimensional structure using an organometallic vapor phase epitaxial method, wherein the active layer having a desired high index plane is grown by regulating the growth conditions of the active layer in the above-described active layer growth step.

2. The production method of a substrate for nitride semiconductor device according to claim 1, wherein regulation of the growth conditions of the above-described active layer is conducted by the growth temperature.

3. The production method of a substrate for nitride semiconductor device according to claim 1, wherein the above-described mask is a mask made of $SiO_2$, and the above-described three-dimensional structure is grown so as to cover the above-described mask completely.

4. The production method of a substrate for nitride semiconductor device according to claim 1, wherein the above-described mask is a mask made of $SiO_2$, the above-described three-dimensional structure is grown so as not to cover the above-described mask completely, and Si is intentionally doped to the active layer.

5. The production method of a substrate for nitride semiconductor device according to claim 1, wherein the above-described mask is a mask made of $SiO_2$, the above-described three-dimensional structure is grown so as to cover the above-described mask completely, then, Si is intentionally doped.

6. The production method of a substrate for nitride semiconductor device according to claim 1, wherein the above-described metal nitride is GaN.

7. The production method of a substrate for nitride semiconductor device according to claim 1, wherein the rare earth element to be doped in the above-described active layer growth step is Eu.

8. The production method of a substrate for nitride semiconductor device according to claim 1, wherein the method comprises a mask step of masking the above-described active layer formed.

9. A substrate for nitride semiconductor device fabricated by using a production method of a substrate for nitride semiconductor device according to claim 1.

10. The nitride semiconductor device fabricated by using a substrate for nitride semiconductor device according to claim 9.

11. A production method of a substrate for nitride semiconductor device using a metal nitride, comprising a mask formation step of using a metal nitride as a base material and forming a mask having a prescribed shape on the above-described base material, a three-dimensional structure growth step of growing a three-dimensional structure made of the same material as the above-described base material on the above-described base material having the mask formed thereon using a selective growth technique so that an undoped layer having a higher index plane than the above-described base material is formed on the lateral face, and an active layer growth step of growing an active layer containing a rare earth element doped so as to replace a metal element of the above-described metal nitride on the undoped layer on the lateral face of the above-described three-dimensional structure using an organometallic vapor phase epitaxial method, wherein the active layer having a desired high index plane is formed on the undoped layer on the lateral face of the above-described three-dimensional structure by regulating the growth conditions of the three-dimensional structure.

12. The production method of a substrate for nitride semiconductor device according to claim 11, wherein the active layer having a desired high index plane is grown by regulating the growth conditions of the active layer in the above-described active layer growth step.

13. The production method of a substrate for nitride semiconductor device according to claim 11, wherein regulation of the growth conditions of the above-described three-dimensional structure is conducted by the growth temperature.

14. A substrate for nitride semiconductor device using a metal nitride fabricated by using a production method of a substrate for nitride semiconductor device, comprising a mask formation step of using a metal nitride as a base material and forming a mask having a prescribed shape on the above-described base material, a three-dimensional structure growth step of growing a three-dimensional structure made of the same material as the above-described base material on the above-described base material having the mask formed thereon using a selective growth technique so that an undoped layer having a higher index plane than the above-described base material is formed on the lateral face, and an active layer growth step of growing an active layer containing a rare earth element doped so as to replace a metal element of the above-described metal nitride on the undoped layer on the lateral face of the above-described three-dimensional structure using an organometallic vapor phase epitaxial method, wherein the active layer having a desired high index plane is grown by regulating the growth conditions of the active layer in the above-described active layer growth step.

15. The substrate for nitride semiconductor device using a metal nitride fabricated by using a production method of a substrate for nitride semiconductor device, comprising a mask formation step of using a metal nitride as a base material and forming a mask having a prescribed shape on the above-described base material, a three-dimensional structure growth step of growing a three-dimensional structure made of the same material as the above-described base material on the above-described base material having the mask formed thereon using a selective growth technique so that an undoped layer having a higher index plane than the above-described base material is formed on the lateral face, and an active layer growth step of growing an active layer containing a rare earth element doped so as to replace a metal element of the above-described metal nitride on the undoped layer on the lateral face of the above-described three-dimensional structure using an organometallic vapor phase epitaxial method, wherein the active layer having a desired high index plane is formed on the undoped layer on the lateral face of the above-described three-dimensional structure by regulating the growth conditions of the three-dimensional structure.

16. The production method of a red light emitting semiconductor device using GaN, InN, AlN or a mixed crystal composed of any two or more of them, comprising
a mask formation step of using GaN, InN, AlN or a mixed crystal composed of any two or more of them as a base material and forming a mask having a prescribed shape on the above-described base material,
a three-dimensional structure growth step of growing a three-dimensional structure made of the same material as the above-described base material on the above-described base material having the above-described mask formed thereon using a selective growth technique so that an undoped layer having a higher index plane than the above-described base material is formed on the lateral face, and
an active layer growth step of growing an active layer containing Eu or Pr doped so as to replace Ga, In or Al on the undoped layer on the lateral face of the above-described three-dimensional structure using an organometallic vapor phase epitaxial method.

17. The production method of a red light emitting semiconductor device according to claim 16,
wherein the above-described mask is a mask made of $SiO_2$, and the above-described three-dimensional structure is grown so as to cover the above-described mask completely.

18. The production method of a red light emitting semiconductor device according to claim 16,
wherein the above-described active layer having a desired index plane is grown in the above-described active layer growth step by regulating the growth temperature.

19. The production method of a red light emitting semiconductor device according to claim 16,
wherein the element doped in the above-described active layer growth step is Eu.

20. A red light emitting semiconductor device fabricated by using a production method of a red light emitting semiconductor device according to claim 16.

* * * * *